United States Patent [19]

Adams

[11] Patent Number: 4,732,042
[45] Date of Patent: Mar. 22, 1988

[54] CAST MEMBRANE PROTECTED PRESSURE SENSOR

[75] Inventor: Victor J. Adams, Tempe, Ariz.

[73] Assignee: Motorola Inc., Schaumburg, Ill.

[21] Appl. No.: 855,055

[22] Filed: Apr. 22, 1986

[51] Int. Cl.⁴ .............................................. G01L 7/08
[52] U.S. Cl. ........................................ 73/706; 73/715;
73/754; 73/DIG. 4; 338/4; 338/42
[58] Field of Search .................... 357/26, 72; 73/706,
73/715, 723, 725, 726, 727, 756, DIG. 4, 754,
724; 338/4, 42, 226, 252, 253; 174/52 PE;
361/331; 128/748, 675

[56] References Cited

U.S. PATENT DOCUMENTS

| | | | |
|---|---|---|---|
| 2,569,987 | 10/1951 | Frondel | 73/727 |
| 3,405,559 | 10/1968 | Moffatt | 73/724 |
| 3,619,742 | 11/1971 | Rud, Jr. | 361/283 |
| 3,808,480 | 4/1974 | Johnston | 361/283 |
| 3,943,915 | 3/1976 | Severson | 128/653 |
| 4,314,480 | 2/1982 | Becker | 73/706 |
| 4,367,651 | 1/1983 | Cameron et al. | 73/706 |
| 4,565,096 | 1/1986 | Knecht | 73/718 |

FOREIGN PATENT DOCUMENTS 122125 9/1980 Japan ..................................... 73/727

Primary Examiner—A. D. Pellinen
Assistant Examiner—H. L. Williams
Attorney, Agent, or Firm—Robert M. Handy

[57] ABSTRACT

A solid state semiconductor pressure sensor is described in which the pressure sensor element is protected from the ambient whose pressure is being measured by a combination of a pressure transfer medium and a thin covering membrane. A method is described for applying the thin covering membrane so as to substantially avoid entrapment of air or formation of voids in the pressure transfer medium which would degrade the performance of the sensor. The pressure transfer medium is a gel-like material such as a silicone rubber. The membrane is chosen to be substantially impermeable to the ambients being measured and sufficiently flexible to avoid attenuation of the input pressure signal. The membrane is cast in place by applying a thin liquid coating or a heat deformable film over the pressure transfer medium and then converting it into a thin solid membrane stuck to the pressure transfer medium and the pressure sensor body.

3 Claims, 8 Drawing Figures

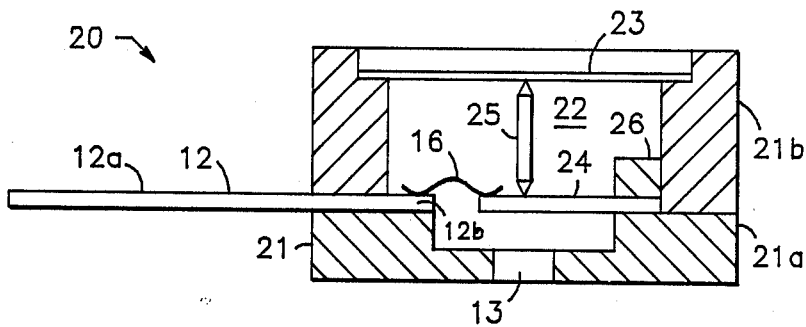
FIG. 3 — PRIOR ART —
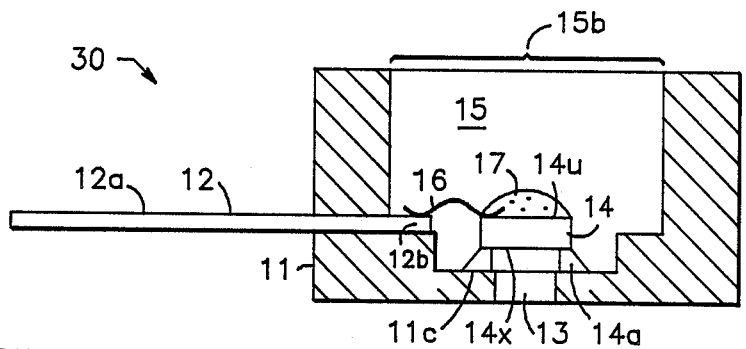
FIG. 4A
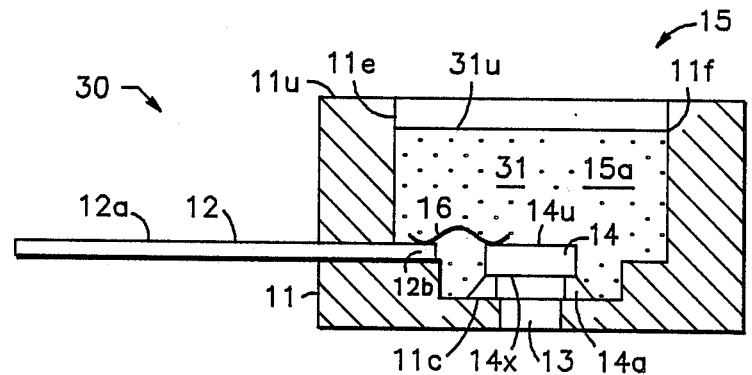
FIG. 4B

CAST MEMBRANE PROTECTED PRESSURE SENSOR

BACKGROUND OF THE INVENTION

1. Field of the Invention

This invention relates in general to solid state pressure sensors and, more particularly, to means and methods for protecting a semiconductor pressure sensor element from the atmosphere whose pressure is being sensed.

This invention is related to the subject matter disclosed in copending application 855,012, now U.S. Pat. No. 4,686,764 issued Aug. 18, 1987.

2. Background Art

Solid state pressure sensors are being employed in a variety of new applications because of their small size and compatibility with other electronic systems. Semiconductor chips or die are generally used as the pressure sensing elements. However, such semiconductor sensing elements are particularly sensitive to contamination. Thus, if the surface of the semiconductor sensing element is exposed directly to the ambient whose pressure is being measured, the semiconductor sensing element may be adversely effected.

A number of different approaches have been used in the prior art in order to separate the semiconductor sensing element from the ambient being measured. Among these are, for example, the use of die coats and the use of metal diaphragms coupled to the semiconductor sensing element by rigid bars or levers. None of these approaches has proved entirely satisfactory. Accordingly, a need continues to exist for improved means and methods for protecting semiconductor pressure sensing elements from the ambient whose pressure is being measured.

Accordingly, it is an object of the present invention to provide an improved means and method for protecting a semiconductor pressure sensing element from the ambient whose pressure is being measured.

It is a further object of the present invention to provide an improved means and method whereby the semiconductor sensing element is protected from the ambient without substantial loss in sensitivity.

It is an additional object of the present invention to provide an improved means and method for protecting a semiconductor pressure sensing element from the ambient without the use of metal diaphragms with rods or levers.

It is a further object of the present invention to provide an improved means and method for protecting a semiconductor pressure sensing element which is of light weight and extremely shock resistant.

SUMMARY OF THE INVENTION

The attainment of the foregoing and other objects and advantages is achieved through the present invention wherein there is provided a dielectric body; a cavity in the dielectric body having a first surface for receiving a pressure sensing element and a second surface for contacting a diaphragm means; a pressure sensing element mounted on the first surface with its pressure sensing region in the cavity; electrical lead means in the body for providing electrical connections to the sensing element; a cast-in-place diaphragm means sealed to the second surface to prevent materials from the environment from reaching the sensor element; and a non-gaseous pressure transfer medium in contact with the second surface, the pressure sensing region of the sensing element and the diaphragm means, and substantially filling the space of the cavity between the pressure sensing element, the second surface, and the diaphragm means.

The pressure transfer medium may be a liquid or a gel-like material or elastic solid. The cured pressure transfer medium should have an elasticity, as measured with a Universal Penetrometer using a 19.5 gm shaft and a 6.35 mm diameter foot, in the range 2 to 8 mm penetration or larger. The diaphragm means must be flexible in order to respond to variations in external pressure and transfer the external pressure through the pressure transfer medium to the sensing element without substantial attenuation.

The attainment of the foregoing and other objects and advantages is further achieved through a method for forming a sealed pressure sensor, comprising: providing a body having a recess therein for receiving a pressure sensor element on a first surface of the recess, wherein the recess has an opening and a second surface extending from the opening to the first surface; mounting the pressure sensing element on the first surface; partly filling the recess with a gel-like pressure transfer medium which is in contact with the pressure sensor and with the second surface up to a first level and which has an exposed surface; and casting a membrane in place over the exposed surface of the pressure transfer medium and in contact with the second surface. The cast-in-place membrane is preferably formed by placing a small amount of a curable liquid polymer on the pressure transfer medium, spreading it out to contact the second surface, and then curing it to form a thin impermeable membrane bonded to the second surface and the pressure transfer medium.

The details of the present invention will be more completely understood in terms of the drawings and description which follow.

BRIEF DESCRIPTION OF THE DRAWINGS

FIG. 3 shows in simplified schematic form a cross-section through a semiconductor solid state pressure sensor employing a diaphragm, according to the prior art; and FIGS. 4A–D show in simplified schematic form cross-sections through a solid state semiconductor pressure sensor at different stages of fabrication, according to the present invention.

DETAILED DESCRIPTION OF THE DRAWINGS

For purposes of explanation, the pressure sensor assemblies and structures described herein are illustrated for a semiconductor solid state sensing element. However, those of skill in the art will understand that other solid state sensing elements having a region for sensing a pressure to be measured on a first surface and a region for sensing a reference pressure on a second surface, opposite the first surface may equally well be used.

Figure 1:
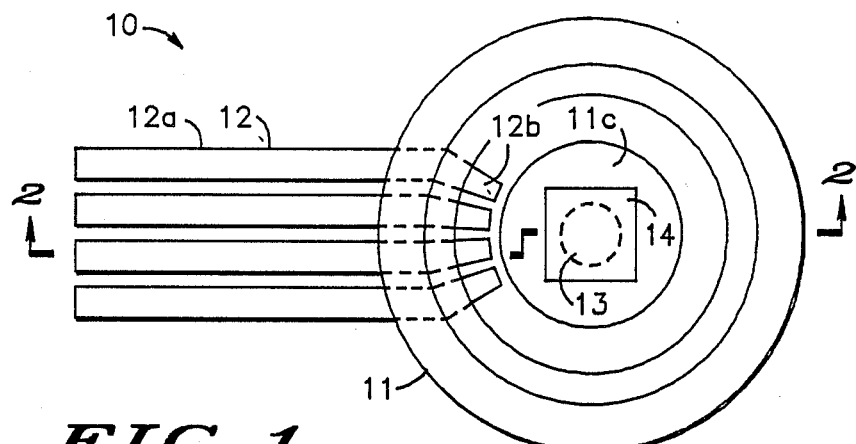
FIG. 1 shows in simplified schematic form a top view of a typical solid state semiconductor pressure sensor with the lid removed.
Figure 2A:
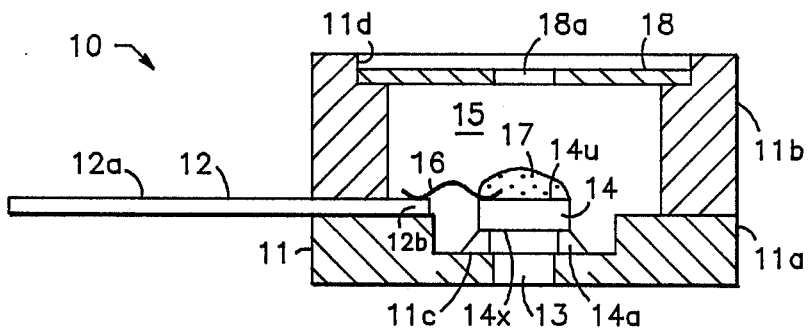
FIG. 2A shows a cross-section in simplified schematic form through the pressure sensor of FIG. 1 with a lid included.
Figure 2B:
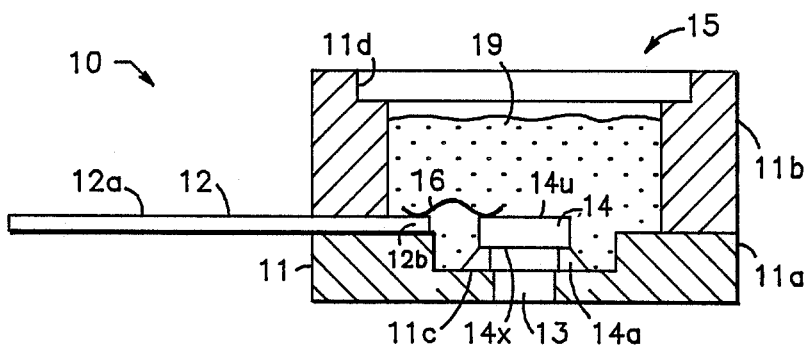
FIG. 2B shows a cross-section similar to that of FIG. 2A but according to a different embodiment and without a lid.

FIG. 1 shows in simplified schematic form a top view of a solid state pressure sensor. FIGS. 2A–B show cross-sections of the sensor of FIG. 1. In FIGS. 1 and 2A–B, pressure sensor 10 comprises body 11 having internal cavity 15 in which is mounted semiconductor solid state sensing element 14. Insulated leads 12 having exterior portions 12a and interior portions 12b are provided which extend through the wall of body 11 into cavity 15. Sensing element 14 is mounted on surface 11c in cavity 15 of body 11 by means 14a above hole 13. Reference pressure receiving portion 14x of sensing element 14 is aligned over hole 13. Sensing element 14 is connected to leads 12 by (typically) wirebonds 16. Body 11 may be conveniently formed of two separate parts 11a, 11b as indicated in FIGS. 2A–B. Alternatively, body 11 may be formed in a single unit as has been described for example, in copending application Ser. No. 784,980 by Victor J. Adams, entitled "Unibody Pressure Transducer Package", and commonly assigned. Body 11 is conveniently a dielectric material.

FIG. 2A illustrates the embodiment in which protective lid 18 containing hole 18a is inserted in notch 11d in body 11, and in which die coat 17 is applied over sensing element 14. While such an arrangement provides mechanical protection for sensing element 14, only die coat 17 prevents the ambient whose pressure is intended to be measured from reaching upper surface 14u of sensing element 14. It has been found, that materials which are suitable die coats for semiconductor sensing elements are frequently permeable to or adversely affected by a number of ambients (e.g., gasoline, hydrocarbon solvents, exhaust gases, etc.) whose pressure is desired to be measured. Accordingly, the sensor configuration illustrated in FIG. 2A is frequently subject to instability, drift, and degradation in such ambients. Further, the arrangement of FIG. 2A permits light to reach surface 14u of sensor 14, which may further disturb its operation.

Improved performance is obtained by replacing die coat 17 by opaque material 19 which is placed in cavity 15 surrounding sensing element 14, as illustrated in FIG. 2B. However, it has been found that materials which are sufficiently resilient to be used in region 19 without causing substantial loss in sensitivity through attenuation of the input pressure signal, are generally also permeable to or attacked by many ambients.

A method which avoids some of the above problems and which has been used in the prior art is illustrated in FIG. 3. FIG. 3 is a cross-section through solid state pressure sensing element 20 comprising body 21 having upper and lower parts 21a–b leads 12 having external portions 12a and internal por-tions 12b, and bar shaped semiconductor sensing element 24 which is attached at one end to body 21 by clamp means 26 and connected to leads 12 via wirebonds 16. Metal diaphragm 23 separates cavity 22 containing sensing element 24 from the ambient whose pressure is intended to be measured. Hole 13 allows the reference pressure to be communicated to cavity 22. Rigid bar or rod 25 provides mechanical coupling between the center of diaphragm 23 and semiconductor sensing element 24.

While the configuration of FIG. 3 protects sensing element 24 from the ambient whose pressure is intended to be measured, the arrangement of FIG. 3 is expensive to manufacture because of the small piece parts which must be individually handled and precisely located within body 21 and is comparatively fragile. It is well known, for example, that semiconductor pressure sensing elements are extremely brittle. In order to have high sensitivity in the arrangement of FIG. 3, cantilever bar shaped element 24 must be directly coupled via rod 25 to diaphragm 23. Over-pressure conditions applied to diaphragm 23 can readily cause catastrophic failure of sensing element 24. A further disadvantage of the structure of FIG. 3 is that the sensitivity and calibration of the sensor depend critically upon the placement of bar 25 on sensing element 24 and diaphragm 23. A further problem with the arrangement of FIG. 3 is that the active regions of sensing element 24 are exposed to the reference ambient entering via hole 13.

These and other disadvantages may be overcome by the means and method of the present invention which are illustrated in FIGS. 4A–D. FIGS. 4A–D are simplified schematic cross-sectional views of a solid state pressure sensor, similar to FIGS. 2A–B, but according to the present invention. FIGS. 4A–D illustrate the structure at different stages of fabrication.

As shown in FIG. 4A, solid state sensor 30 comprises body 11 having leads 12 with external portions 12a and internal portions 12b. Semiconductor sensing element 14 having reference pressure receiving region 14x is mounted by means 14a on surface 11c in cavity 15 of body 11 over hole 13. Wirebonds 16 are used for coupling the active regions of sensor 14 to leads 12. As shown in FIG. 4A, upper surface 14u of sensor element 14 may be sealed to conventional die coat 17. However, this is not essential and die coat 17 may be omitted. Sensing element 14 may be sealed to surface 11c by any convenient means 14a well known in the art. Organic adhesives are a suitable means. The reference pressure entering via hole 13 acts only on portion 14x of sensor 14 and does not enter cavity 15.

Once die 14 has been mounted in cavity 15 of body 11, then (see FIG. 4B) lower portion 15a of cavity 15 is filled with pressure transfer medium or material 31. It is important that during filling of lower portion 15a of cavity 15 with material 31 that trapped gas pockets or enclosed voids be avoided as much as possible. This is conveniently accomplished by using a material for pressure transfer medium 31 which is a liquid at the time of introduction. One or more measured droplets of the material are conveniently placed on die 14 from where they flow into and fill lower portion 15a of cavity 15. Upper surface 31u of material 31 extends to level 11f on sidewall 11e of cavity 15. It is desirable that upper surface 31u of material 31 not be above upper surface 11u of body 11, but this is not essential. It is only essential (see FIGS. 4C–D) that material 31 fill the space between sensor 14 and membrane 32 and that membrane 32 cover the exposed surface of medium 31 and bond to body 11 at the periphery of the exposed surface of medium 31. It is desirable that upper surface 31u of material 31 be substantially smooth. Upper surface 31u may be concave, convex, or flat.

Medium 31 may be of any convenient material which does not contaminate sensor element 14 and which remains in liquid or at least gel-like or elastic form after introduction. If a material is used which sets up or becomes hard such as, for example, many epoxies, then the pressure signal which will subsequently be introduced via opening 15b in body 11 will be attenuated before reaching sensor element 14 and the finished device will be insensitive. Accordingly, it is desirable that material 31 have an elasticity, as measured using a Universal Penetrometer with a 19.5 gm shaft and 6.35 mm diameter foot, in the range 2–8 mm penetration or larger.

More elastic materials can also be used. If the material is cured after being introduced into cavity 15, then the above-noted elasticities apply after curing. An example of a suitable material is Visilox type 191 silicone rubber manufactured by the Visilox Company of Troy, N.Y.

Visilox 191 is a material which is initially in a liquid or semi-liquid state and upon curing sets up to the consistency of a very soft rubber-like material or gel. In order to make the material opaque to light, approximately 40 percent by volume of titanium dioxide is preferably mixed into the Visilox 191 material prior to its being introduced into cavity 15, but this is not essential. After being placed into portion 15a of cavity 15, the Visilox 191 material is conveniently vacuum cured following the manufactures' recommendations. Approximately 30 minutes at about 150° C. is suitable. Those of skill in the art will understand that other curing cycles can also be used. The Visilox 191 shrinks slightly on curing, as is indicated by the slightly concave shape of surface 31u in FIG. 4C. Material 31 may be cured or left uncured, and curing can be performed before, during, or after formation of membrane 32. It is important that there be substantially no voids in pressure transfer medium 31.

Figure 4C:
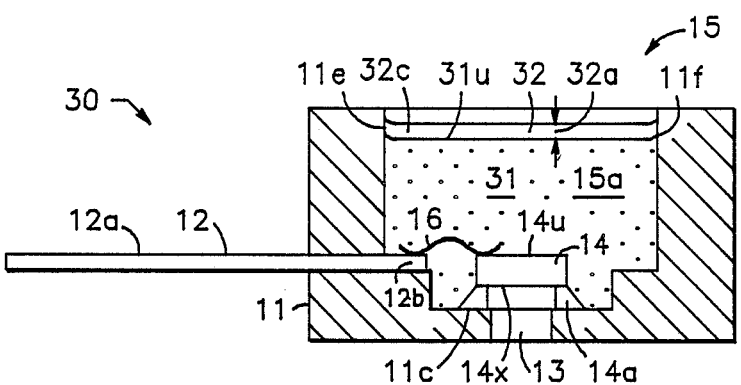
Figure 4D:
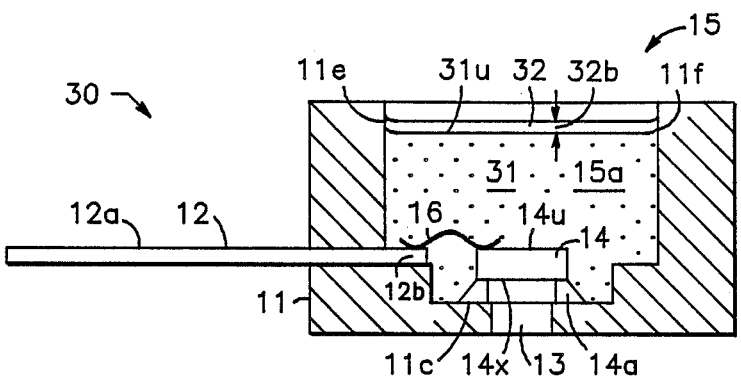

It is desired to cover pressure transfer medium 31 with membrane 32 so as to obtain the structure shown in FIGS. 4D. Membrane 32 must be flexible and substantially impermeable to the ambients of interest. It is important that membrane or diaphragm 32 be applied to pressure transfer material 31 in such a way that no air pockets or other voids are trapped between the two. If significant voids or pockets are present between the two layers or in medium 31, the sensitivity and linearity of the pressure transducer will be adversely affected. Substantially void-free application of membrane 32 may be conveniently accomplished by the method illustrated in FIGS. 4C-D.

Membrane 32 is cast in place above material 31 in contact with surface 11e of body 11 (see FIGS. 4C-D). This is conveniently accomplished by placing one or more drops of curable membrane forming liquid material 32c on medium 31, spreading it out laterally to contact surface 11e of cavity 15, and then curing it or otherwise converting it to solid membrane 32. Membrane forming material 32c may shrink or expand on curing. FIGS. 4C-D illustrate the situation where material 32c contracts slightly on curing as indicated by the difference in thicknesses 32a and 32b. However, it is important that any shrinkage be controlled so as not to have membrane 32 become detached from body 11. Curing may take place, for example, by means of solvent evaporation, reaction with the ambient, or polymerization. Any method will serve so long as it provides a substantially impermeable membrane sealed to the surface of body 11 and medium 31. Since material 32c is applied as a liquid it will be drawn partly up onto surface 11e by capillary action. This is desirable for a good seal. Accordingly, membrane 32 will tend to taper to a small or zero thickness at its outer periphery.

The presence of membrane 32 has been found to be essential to prevent some undesirable ambients from reaching sensor element 14. Materials such as Visilox 191, while having desirable properties as a pressure transfer medium are still sufficiently permeable to many ambients so as to provide insufficient protection.

Membrane 32 may be made of any convenient flexible substantially impermeable material. It is important that membrane 32 be flexible since if it is stiff, the pressure signal will be attenuated prior to reaching sensor element 14. It is desirable that material 32c adhere well to body 11 and pressure transfer medium 31. Dow-Corning Type 94-003 fluorosilicone is an example of a suitable membrane forming material. It should be cured according to the manufacturer's directions. Heating for approximately 15 minutes at about 150° C. is suitable.

Pressure sensors were constructed wherein body 11 was circular and in which opening 15b had a diameter of approximately 11.2 mm. Cavity 15 was partly filled with Visilox 191 pressure transfer medium and covered with a Type 94-003 fluorosilicone cast-in-place membrane, as described above. The resulting membrane was about 0.005 inches (0.13 mm) thick. It was determined that the sensitivity of the resulting unit was substantially the same with and without membrane 32.

If a harder or denser membrane material is desired to be used, such as for example, a polyimide material, then the thickness of the cast-in-place membrane should be correspondingly reduced in order to maintain the same sensitivity. For example, a polyimide membrane should have a thickness of approximately 0.002 inches (0.05 mm). Cured membrane thickness in the range 0.002 to 0.008 inches (0.05 to 0.203 mm) are useful with 0.002 to 0.005 inches (0.05 to 0.127 mm) generally being preferred. It has been found that membrane materials with Shore A hardness (after curing) of less than 70 are useful, with hardnesses in the range 30-70 being preferred. Other things being equal, the membrane thickness for different materials should be adjusted approximately inversely proportional to their relative hardness.

Alternatively, the structure of FIGS. 4C-D may be obtained by proceeding as described in connection with FIGS. 4A-B, then loosely covering surface 31u with a heat deformable membrane material having a lateral size slightly larger than opening 15b, then heating the membrane material to collapse it onto surface 31u of medium 31 and stick it to surface 11e of body 11 at circumferential location 11f. This method is particularly useful where no cavity is used in body 11 or when cavity 11 is filled completely with pressure transfer medium 31. This procedure is best carried out in a vacuum.

It will be appreciated by those of skill in the art, that different membrane materials which are particularly impermeable to certain ambients may be used to cover sensors intended for such ambients.

It will also be appreciated by those of skill in the art, that the above-described structure and method of fabrication provide a particularly convenient membrane protected pressure sensor. No complex mechanical linkages, as were used for example in the structure of FIG. 3, are required. The finished device as illustrated in FIGS. 4D is particularly rugged and uses a minimum number of piece parts. Further, no complex assembly steps are required for forming the membrane or coupling it to the sensing element. Additionally, the device is not readily damaged by over-pressure conditions since the active portion of the semiconductor element is uniformly supported by attachment means 14a surrounding hole 13.

Those of skill in the art will understand that a variety of different sensing elements may be used in connection with the means and method of the present invention, and further that a wide variety of pressure transfer materials may be employed provided they are sufficiently liquid to be applied substantially void-free in filling cavity portion 15a, and sufficiently elastic after installation (and curing) to transmit the pressure applied to membrane 32 to sensor 14 without significant attenuation. Those of skill in the art will also understand that a wide variety of membrane materials may be used provided they are substantially impermeable to the ambient whose pressures are intended to be measured, suitable for application by the methods described herein, and sufficiently flexible to avoid attenuation of the pressure signal. Accordingly, it is intended to include all such variations in the claims which follow.

I claim:

1. An environmentally protected pressure sensor, comprising:
   a body;
   a cavity formed in an opening in said body, having a first surface for receiving a pressure sensing element and a substantially rigid second surface extending from said first surface to said opening;
   a pressure sensing element sealably mounted on said first surface and having a pressure sensing region facing said cavity;
   lead means in said body for providing electrical connections to said sensing element, wherein said lead means have first ends external to said body and second ends in said cavity;
   a non-gaseous pressure transfer medium in contact with said pressure sensing region and partially filling said cavity and in contact with said second surface and having an exposed surface; and
   a homogeneous thin flexible membrane means sealed to said second surface and said exposed surface of said pressure transfer medium and responsive to an external pressure, for preventing materials from the environment from reaching said sensor element, wherein said membrane means has a first thickness over said exposed surface and a second thickness less than said first thickness where it seals to said second surface.

2. The pressure sensor of claim 1 wherein said pressure transfer medium has an elasticity, as measured using a Universal Penetrometer with a 19.5 gm shaft and a 6.35 mm diameter foot, in the range of 2-8 mm penetration or larger.

3. The pressure sensor of claim 1 wherein said membrane means has a Shore A hardness less than 70.

* * * * *